(12) United States Patent
Li et al.

(10) Patent No.: US 11,723,180 B2
(45) Date of Patent: Aug. 8, 2023

(54) DISPLAY MODULE AND METHOD FOR MANUFACTURING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Fei Li, Beijing (CN); Zhihui Yan, Beijing (CN); Tianliang Liu, Beijing (CN); Yifei Wang, Beijing (CN); Hao Huang, Beijing (CN); Xu Lu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 21 days.

(21) Appl. No.: 17/467,751

(22) Filed: Sep. 7, 2021

(65) Prior Publication Data

US 2022/0078949 A1    Mar. 10, 2022

(30) Foreign Application Priority Data

Sep. 7, 2020 (CN) .......................... 202010930998.0
Sep. 6, 2021 (CN) .......................... 202111038256.8
Sep. 6, 2021 (CN) .......................... 202122140815.8

(51) Int. Cl.
*H05K 7/20* (2006.01)

(52) U.S. Cl.
CPC ................................ *H05K 7/20963* (2013.01)

(58) Field of Classification Search
CPC ................................................... H05K 7/20963
See application file for complete search history.

(56) References Cited

U.S. PATENT DOCUMENTS

2019/0393433 A1\* 12/2019 Dagn ................. H01L 51/5253
2022/0061195 A1\*  2/2022 Lee ....................... G06F 1/1652

FOREIGN PATENT DOCUMENTS

KR    10-2020-0106279    \*   8/2020   ........ H05K 7/20963

\* cited by examiner

*Primary Examiner* — Mukundbhai G Patel
(74) *Attorney, Agent, or Firm* — Lippes Mathias LLP

(57) ABSTRACT

Disclosed are a display module and a method for manufacturing the same, and a display device. The display module includes: a display panel, a heat dissipation layer, a heat conduction assembly, and a driving chip, wherein the display panel includes a first part and a second part opposite to each other, and a bending part connecting the first part and the second part; the heat dissipation layer is disposed on a side, proximal to the second part, of the first part; the heat conduction assembly is disposed between the heat dissipation layer and the second part; an area of an orthographic projection of the heat conduction assembly on the first part is smaller than an area of an orthographic projection of the heat dissipation layer on the first part; and the driving chip is disposed on a side, distal from the heat conduction assembly, of the second part distal.

14 Claims, 4 Drawing Sheets

DISPLAY MODULE AND METHOD FOR MANUFACTURING SAME, AND DISPLAY DEVICE

CROSS REFERENCE TO RELATED APPLICATION

This application claims priority to Chinese Patent Application No. 202010930998.0, filed on Sep. 7, 2020 and entitled "DISPLAY MODULE AND DISPLAY DEVICE", Chinese Patent Application No. 202111038256.8, filed on Sep. 6, 2021 and entitled "DISPLAY MODULE AND DISPLAY DEVICE", and Chinese Patent Application No. 202122140815.8 filed on Sep. 6, 2021 and entitled "DISPLAY MODULE AND DISPLAY DEVICE", the disclosure of which is incorporated herein by reference in their entireties.

TECHNICAL FIELD

The present disclosure relates to a display module and a method for manufacturing the same, and a display device.

BACKGROUND

At present, electronic products are more and more widely used in people's life, and a display module is a core component of the electronic product for implementing a display function. In the era of pursuing visual effects, a full-screen and large-screen display effect of the electronic product such as a mobile phone gains more and more favor of users.

SUMMARY

In view of shortcomings of methods in the related art, embodiments of the present disclosure provide a display module and a method for manufacturing the same, and a display device.

In a first aspect, a display module is provided. The display module includes:

a display panel, including a first part and a second part opposite to each other, and a bending part connecting the first part and the second part;

a heat dissipation layer, disposed on a side, proximal to the second part, of the first part, and fixedly connected to the first part;

a heat conduction assembly, disposed between the heat dissipation layer and the second part, and fixedly connected to the heat dissipation layer and the second part, wherein an area of an orthographic projection of the heat conduction assembly on the first part is smaller than an area of an orthographic projection of the heat dissipation layer on the first part; and a driving chip disposed on a side, distal from the first part, of the second part.

In some embodiments, the heat conduction structure includes.

a supporting structure including a base portion and a protruding portion, wherein the protruding portion surrounds a periphery of a target side of the base portion, and the protruding portion and the base portion form a receiving chamber; and a heat conduction structure disposed in the receiving chamber and fixedly connected to the supporting structure.

In some embodiments, the heat conduction structure is a plate-shaped integrated structure; and a surface of a side, distal from the base portion, of the heat conduction structure is flush with a surface of a side, distal from the base portion, of the protruding portion.

In some embodiments, the heat conduction assembly satisfies at least one of the following conditions:

a spacing between the heat conduction structure and the protruding portion is less than 0.3 mm;

a thickness of the heat conduction structure in a first direction ranges from 0.02 mm to 0.1 mm, wherein the first direction is perpendicular to the second part;

a thickness of the base portion in the first direction ranges from 0.06 mm to 0.25 mm; and a thickness of the protruding portion in a second direction ranges from 0.8 mm to 1.5 mm, wherein the second direction is perpendicular to the first direction.

In some embodiments, the supporting structure further includes: a covering portion, disposed on a side, distal from the base portion, of the protruding portion, wherein the covering portion covers the receiving chamber.

In some embodiments, the heat conduction assembly satisfies at least one of the following conditions:

a material of the supporting structure includes polyethylene terephthalate PET; and a material of the heat conduction structure includes graphite.

In some embodiments, an orthographic projection of the heat conduction structure on the second part is represented by a first rectangle, and an orthographic projection of the supporting structure on the second part is represented by a second rectangle; and a center of the first rectangle is coincident with the center of the second rectangle, wherein a length direction of the first rectangle is parallel to a length direction of the second rectangle.

In some embodiments, a length of the first rectangle ranges from 19 mm to 119 mm, and a width of the first rectangle ranges from 4 mm to 19 mm;

a length of the second rectangle ranges from 20 mm to 120 mm, and a width of the second rectangle ranges from 5 mm to 20 mm.

In some embodiments, the heat conduction assembly satisfies either of the following conditions:

the heat conduction structure is disposed between the supporting structure and the heat dissipation layer; and the heat conduction structure is disposed between the supporting structure and the second part.

In some embodiments, the heat conduction assembly further includes a first adhesive layer;

wherein the first adhesive layer is disposed between the heat conduction structure and the supporting structure, and the heat conduction structure is fixedly connected to the supporting structure by the first adhesive layer.

In some embodiments, a thickness of the first adhesive layer in a first direction ranges from 0.01 mm to 0.05 mm, wherein the first direction is perpendicular to the second part.

In some embodiments, an orthographic projection of the driving chip on the second part is at least partially overlapped with an orthographic projection of the heat conduction assembly on the second part.

In some embodiments, the orthographic projection of the driving chip on the second part is within the orthographic projection of the heat conduction assembly on the second part.

In some embodiments, the heat dissipation layer includes at least one film layer, wherein a film layer, in the at least one film layer, on a side proximal to the heat conduction assembly is a metal layer.

In some embodiments, a thickness of the metal layer in a first direction ranges from 0.03 mm to 0.05 mm, wherein the first direction is perpendicular to the second part.

In some embodiments, the display module satisfies at least one of the following conditions:

the display module further includes a second adhesive layer disposed between the heat conduction assembly and the heat dissipation layer, and the heat conduction assembly is fixedly connected to the heat dissipation layer by the second adhesive layer;

the display module further includes a third adhesive layer disposed between the heat conduction assembly and the second part, and the heat conduction assembly is fixedly connected to the second part by the third adhesive layer; and the display module further includes a fourth adhesive layer disposed between the heat dissipation layer and the first part, and the heat dissipation layer is fixedly connected to the first part by the fourth adhesive layer.

In some embodiments, a thickness of the second adhesive layer in a first direction ranges from 0.02 mm to 0.1 mm, wherein the first direction is perpendicular to the second part;

a thickness of the third adhesive layer in the first direction ranges from 0.02 mm to 0.1 mm; and a thickness of the fourth adhesive layer in the first direction ranges from 0.01 mm to 0.1 mm.

In some embodiments, the orthographic projection of the driving chip on the second part is within the orthographic projection of the heat conduction assembly on the second part;

a spacing between the heat conduction structure and the protruding portion is less than 0.3 mm; the thickness of the heat conduction structure in a first direction ranges from 0.02 mm to 0.1 mm, wherein the first direction is perpendicular to the second part; the thickness of the base portion in the first direction ranges from 0.06 mm to 0.25 mm; and the thickness of the protruding portion in a second direction ranges from 0.8 mm to 1.5 mm, wherein the second direction is perpendicular to the first direction;

the orthographic projection of the heat conduction structure on the second part is represented by a first rectangle, and the orthographic projection of the supporting structure on the second part is represented by a second rectangle; the center of the first rectangle coincides with the center of the second rectangle, and the length direction of the first rectangle is parallel to the length direction of the second rectangle; the length of the first rectangle ranges from 19 mm to 119 mm, and the width of the first rectangle ranges from 4 mm to 19 mm; the length of the second rectangle ranges from 20 mm to 120 mm, and the width of the second rectangle ranges from 5 mm to 20 mm;

the heat conduction assembly further includes a first adhesive layer, a second adhesive layer, and a third adhesive layer; wherein the first adhesive layer is disposed between the heat conduction structure and the supporting structure, and the heat conduction structure is fixedly connected to the supporting structure by the first adhesive layer; the second adhesive layer is disposed between the heat conduction assembly and the heat dissipation layer, and the heat conduction assembly is fixedly connected to the heat dissipation layer by the second adhesive layer; the third adhesive layer is disposed between the heat conduction assembly and the second part, and the heat conduction assembly is fixedly connected to the second part by the third adhesive layer; the thickness of the first adhesive layer in the first direction ranges from 0.01 mm to 0.05 mm; the thickness of the second adhesive layer in the first direction ranges from 0.02 mm to 0.1 mm; and the thickness of the third adhesive layer in the first direction ranges from 0.02 mm to 0.1 mm;

the heat dissipation layer includes at least one film layer, and the film layer, in the at least one film layer, on a side proximal to the heat conduction assembly is a metal layer, wherein a thickness of the metal layer in the first direction ranges from 0.03 mm to 0.05 mm;

the display module further includes a fourth adhesive layer disposed between the heat dissipation layer and the first part, and the heat dissipation layer is fixedly connected to the first part by the fourth adhesive layer; the thickness of the fourth adhesive layer in the first direction ranges from 0.01 mm to 0.1 mm;

the supporting structure further includes: a covering portion, disposed on a side, distal from the base portion, of the protruding portion, wherein the covering portion covers the receiving chamber.

In some embodiments, the heat conduction assembly satisfies at least one of the following conditions: a material of the supporting structure includes PET, and a material of the heat conduction structure includes graphite; and the heat conduction assembly satisfies either of the following conditions;

the heat conduction structure is disposed between the supporting structure and the heat dissipation layer, and the heat conduction structure is disposed between the supporting structure and the second part.

In a second aspect, a method for manufacturing a display module is provided. The method includes:

providing a display panel, a heat dissipation layer, and a driving chip, wherein the display panel includes a first part and a second part opposite to each other, and a bending part connecting the first part and the second part:

providing a heat conduction assembly; and acquiring the display module by assembling the display panel, the heat dissipation layer, the heat conduction assembly, and the driving chip, wherein in the display module, the heat dissipation layer is disposed on a side, proximal to the second part, of the first part proximal, and is fixedly connected to the first part; the heat conduction assembly is disposed between the heat dissipation layer and the second part, and is fixedly connected to the heat dissipation layer and the second part; an area of an orthographic projection of the heat conduction assembly on the first part is smaller than the area of the orthographic projection of the heat dissipation layer on the first part, and the driving chip is disposed on a side, distal from the first part, of the second part.

In some embodiments, the heat conduction assembly includes a supporting structure and a heat conduction structure; and providing the heat conduction assembly includes:

providing an initial structure;

acquiring the supporting structure including a base portion and a protruding portion by processing the initial structure, wherein the protruding portion surrounds a periphery of a target side of the base portion, and the protruding portion and the base portion form a receiving chamber; and arranging the heat conduction structure in the receiving chamber of the supporting structure, wherein the heat conduction structure is fixedly connected to the supporting structure.

In some embodiments, the heat conduction structure is a plate-shaped integrated structure; and a surface of a side, distal from the base portion, of the heat conduction structure is flush with a surface of a side, distal from the base portion, of the protruding portion.

In some embodiments, the heat conduction assembly satisfies at least one of the following conditions:

a spacing between the heat conduction structure and the protruding portion is less than 0.3 mm;

a thickness of the heat conduction structure in a first direction ranges from 0.02 mm to 0.1 mm, wherein the first direction is perpendicular to the second part:

a thickness of the base portion in the first direction ranges from 0.06 mm to 0.25 mm; and a thickness of the protruding portion in a second direction ranges from 0.8 mm to 1.5 mm, wherein the second direction is perpendicular to the first direction.

In some embodiments, providing the heat conduction assembly further includes:

in response to arranging the heat conduction structure in the receiving chamber of the supporting structure, arranging a covering portion on a side, distal from the base portion, of the protruding portion, wherein the covering portion covers the receiving chamber.

In some embodiments, the heat conduction assembly satisfies at least one of the following conditions:

a material of the supporting structure includes PET; and a material of the heat conduction structure includes graphite.

In some embodiments, an orthographic projection of the heat conduction structure on the second part is represented by a first rectangle, and an orthographic projection of the supporting structure on the second part is represented by a second rectangle; and a center of the first rectangle is coincident with a center of the second rectangle, and a length direction of the first rectangle is parallel to a length direction of the second rectangle.

In some embodiments, a length of the first rectangle ranges from 19 mm to 119 mm, and a width of the first rectangle ranges from 4 mm to 19 mm; and a length of the second rectangle ranges from 20 mm to 120 mm, and a width of the second rectangle ranges from 5 mm to 20 mm.

In some embodiments, the heat conduction assembly satisfies either of the following conditions:

the heat conduction structure is disposed between the supporting structure and the heat dissipation layer, and the heat conduction structure is disposed between the supporting structure and the second part.

In some embodiments, the heat conduction assembly further includes a first adhesive layer; and providing the heat conduction assembly further includes:

arranging the first adhesive layer in the receiving chamber, wherein the first adhesive layer is disposed between the heat conduction structure and the supporting structure, and the heat conduction structure is fixedly connected to the supporting structure by the first adhesive layer.

In some embodiments, a thickness of the first adhesive layer in a first direction ranges from 0.01 mm to 0.05 mm, wherein the first direction is perpendicular to the second part.

In some embodiments, an orthographic projection of the driving chip on the second part is at least partially overlapped with an orthographic projection of the heat conduction assembly on the second part.

In some embodiments, the orthographic projection of the driving chip on the second part is within the orthographic projection of the heat conduction assembly on the second part.

In some embodiments, the heat dissipation layer includes at least one film layer, wherein a film layer, in the at least one film layer, on a side proximal to the heat conduction assembly is a metal layer.

In some embodiments, a thickness of the metal layer in a first direction ranges from 0.03 mm to 0.05 mm, wherein the first direction is perpendicular to the second part.

In some embodiments, the display module further includes a second adhesive layer, and assembling the display panel, the heat dissipation layer, the heat conduction assembly, and the driving chip includes:

fixedly connecting the heat conduction assembly and the heat dissipation layer by the second adhesive layer, wherein the second adhesive layer is disposed between the heat conduction assembly and the heat dissipation layer.

In some embodiments, a thickness of the second adhesive layer in a first direction ranges from 0.02 mm to 0.1 mm, wherein the first direction is perpendicular to the second part.

In some embodiments, the display module further includes a third adhesive layer; and assembling the display panel, the heat dissipation layer, the heat conduction assembly, and the driving chip includes:

fixedly connecting the heat conduction assembly and the second part by the third adhesive layer, wherein the third adhesive layer is disposed between the heat conduction assembly and the second part.

In some embodiments, a thickness of the third adhesive layer in the first direction ranges from 0.02 mm to 0.1 mm.

In some embodiments, the display module further includes a fourth adhesive layer; assembling the display panel, the heat dissipation layer, the heat conduction assembly, and the driving chip includes:

fixedly connecting the heat dissipation layer and the first part by the fourth adhesive layer, wherein the fourth adhesive layer is disposed between the heat dissipation layer and the first part.

In some embodiments, a thickness of the fourth adhesive layer in a first direction ranges from 0.01 mm to 0.1 mm, wherein the first direction is perpendicular to the second part.

In some embodiments, the heat conduction assembly further includes a first adhesive layer, and the display module further includes: a second adhesive layer, a third adhesive layer, and a fourth adhesive layer; and providing the heat conduction assembly further includes:
  prior to arranging the heat conduction structure in the receiving chamber of the supporting structure, arranging the first adhesive layer in the receiving chamber of the supporting structure, wherein the first adhesive layer is disposed between the heat conduction structure and the supporting structure, the heat conduction structure is fixedly connected to the supporting structure by the first adhesive layer, and the thickness of the first adhesive layer in the first direction ranges from 0.01 mm to 0.05 mm;
  in response to arranging the heat conduction structure in the receiving chamber of the supporting structure, arranging a covering portion on a side, distal from the base portion, of the protruding portion, wherein the covering portion covers the receiving chamber.

Assembling the display panel, the heat dissipation layer, the heat conduction assembly, and the driving chip includes:

fixedly connecting the heat conduction assembly and the heat dissipation layer by the second adhesive layer, wherein the second adhesive layer is disposed between the heat conduction assembly and the heat dissipation layer, and the thickness of the second adhesive layer in a first direction ranges from 0.02 mm to 0.1 mm;

fixedly connecting the heat conduction assembly and the second part by the third adhesive layer, wherein the third adhesive layer is disposed between the heat conduction assembly and the second part, and the thickness of the third adhesive layer in the first direction ranges from 0.02 mm to 0.1 mm; and fixedly connecting the heat dissipation layer and the first part by the fourth adhesive layer, wherein the fourth adhesive layer is disposed between the heat dissipation layer and the first part, and the thickness of the fourth adhesive layer in the first direction ranges from 0.01 mm to 0.1 mm, wherein the orthographic projection of the driving chip on the second part is within the orthographic projection of the heat conduction assembly on the second part, the spacing between the heat conduction structure and the protruding portion is less than 0.3 mm; the thickness of the heat conduction structure in a first direction ranges from 0.02 mm to 0.1 mm, and the first direction is perpendicular to the second part; the thickness of the base portion in the first direction ranges from 0.06 mm to 0.25 mm; and the thickness of the protruding portion in a second direction ranges from 0.8 mm to 1.5 mm, and the second direction is perpendicular to the first direction;

the orthographic projection of the heat conduction structure on the second part is represented by a first rectangle, and the orthographic projection of the supporting structure on the second part is represented by a second rectangle; the center of the first rectangle coincides with the center of the second rectangle, and the length direction of the first rectangle is parallel to the length direction of the second rectangle; the length of the first rectangle ranges from 19 mm to 119 mm, and the width of the first rectangle ranges from 4 mm to 19 mm; the length of the second rectangle ranges from 20 mm to 120 mm, and the width of the second rectangle ranges from 5 mm to 20 mm; the heat dissipation layer includes at least one film layer, and the film layer, in the at least one film layer, on a side proximal to the heat conduction assembly is a metal layer; and the thickness of the metal layer in the first direction ranges from 0.03 mm to 0.05 mm;

the heat conduction assembly satisfies at least one of the following conditions: the material of the supporting structure includes PET, and the material of the heat conduction structure includes graphite, and the heat conduction assembly satisfies either of the following conditions: the heat conduction structure is disposed between the supporting structure and the heat dissipation layer, and the heat conduction structure is disposed between the supporting structure and the second part.

In a third aspect, a display device is provided. The display device includes: a power supply assembly, and any one of the display modules as provided in the first aspect, wherein the power supply assembly is configured to supply power to the display module.

Figure 1:
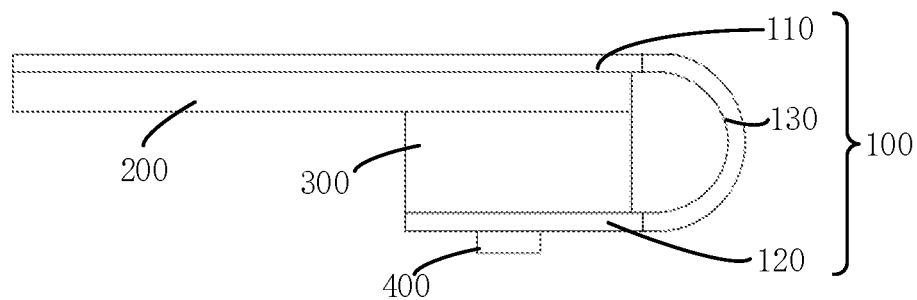
FIG. 1 is a schematic structure diagram of a display module according to an embodiment of the present disclosure.

Reference numerals and denotations thereof:

100—display panel, 110—first part, 111—first substrate, 120—second part, 121—second substrate, and 130—bending part;

200—heat dissipation layer;

300—heat conduction assembly, 310—supporting structure, 311—base portion, 312—protruding portion, 320—heat conduction structure, A—thickness, B—spacing, F1—first direction, F2—second direction, and 3111—target side:

400—driving chip:

500—second adhesive layer:

600—third adhesive layer:

700—glass cover;

800—flexible printed circuit board, and 810—component:

900—connector:

1100—first optically clear adhesive layer:

1200—polarizer;

1300—sensor; and

1400—second optically clear adhesive layer.

DETAILED DESCRIPTION

Description will be made in detail to the present disclosure, examples of which are illustrated in the accompanying drawings. The reference symbols which are the same or similar throughout the accompanying drawings represent the same or similar components or components with the same or similar functions. In addition, where a detailed description of the known technology is unnecessary for the illustrated feature of the present disclosure, it will be omitted. The embodiments described below with reference to the accompanying drawings are intended to be exemplary only, and are only intended to explain the present disclosure, rather than being construed as limitations to the present disclosure.

Those skilled in the art will appreciate that all terms (including technical and scientific terms) as used herein have the same meanings as commonly understood by those of ordinary skill in the art of the present disclosure, unless otherwise defined. It also should be understood that terms such as those defined in the general dictionary should be understood to have the meanings consistent with the meanings in the context of the prior art, and will not be interpreted in an idealized or overly formal meaning unless specifically defined as herein.

It can be understood by those skilled in the art that the singular forms "a," "an," and "the" may also encompass plural forms, unless otherwise stated. It should be further understood that the expression "include" used in the description of the present disclosure means there exists a feature, an integer, a step, an operation, an element and/or a component, but could not preclude existing or adding of one or more other features, integers, steps, operations, elements, components and/or groups thereof. It should be understood that when we refer to an element as being "connected" or "coupled" to another element, it can be directly connected or coupled to the another element, or an intermediate element may be present. Besides, "connected" or "coupled" as used herein may include either a wireless connection or a wireless coupling. The expression "and/or" as used herein includes all or any one and all combinations of one or more of relevant listed items.

The technical solutions of the present disclosure are described in detail below.

Figure 2:
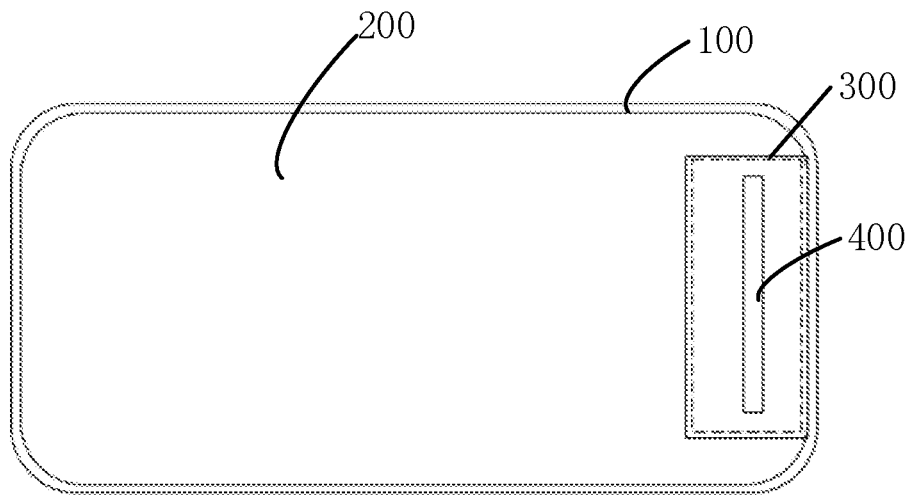
FIG. 2 is a schematic partial bottom view of FIG. 1 to show a structure and positional relationship of a heat dissipation layer, a heat conduction assembly, and a driving chip, and a structure of a bending part and a second part are not shown in FIG. 2.

The embodiments of the present disclosure provide a display module. As shown in FIGS. 1 and 2, the display module includes a display panel 100, a heat dissipation layer 200, a heat conduction assembly 300, and a driving chip 400.

The display panel 100 includes a first part 110 and a second part 120 opposite to each other, and a bending part 130 connecting the first part 110 and the second part 120.

The heat dissipation layer 200 is disposed on a side, proximal to the second part 120, of the first part 110, and is fixedly connected to the first part 110. The heat dissipation layer 200 is configured to dissipate heat conducted by the heat conduction assembly 300 for heat dissipation.

The heat conduction assembly 300 is disposed between the heat dissipation layer 200 and the second part 120, and is fixedly connected to the heat dissipation layer 200 and the second part 120. The heat conduction assembly 300 may not only conduct heat but also serve as a support between the first part 110 and the second part 120 of the display panel 100 for bending the display panel 100. An area of an orthographic projection of the heat conduction assembly 300 on the first part 110 is smaller than an area of an orthographic projection of the heat dissipation layer 200 on the first part 110.

The driving chip 400 is disposed on a side, distal from the heat conduction assembly 300 (or the first part 110), of the second part 120.

In some embodiments, an orthographic projection of the driving chip 400 on the second part 120 is at least partially overlapped with an orthographic projection of the heat conduction assembly 300 on the second part 120, such that the heat conduction assembly 300 can quickly conduct heat generated during operation of the driving chip 400 to the heat dissipation layer 200.

In some embodiments, the orthographic projection of the driving chip 400 on the second part 120 is within the orthographic projection of the heat conduction assembly 300 on the second part 120, such that heat concentrated by the driving chip 400 can be quickly conducted to the heat conduction assembly 300.

In some embodiments, each of the first part 110 and the second part 120 of the display panel 100 in the present disclosure is provided with a supporting protection film. The heat dissipation layer 200 is fixedly connected to the first part 110. That is, the heat dissipation layer may be fixedly connected to the supporting protection film on the first part. The heat conduction assembly 300 is fixedly connected to the second part 120. That is, the heat conduction assembly may be fixedly connected to the supporting protection film on the second part.

In the display module according to the embodiment of the present disclosure, the heat dissipation layer 200 and the heat conduction assembly 300 are arranged between the first part 110 and the second part 120 of the display panel 100. The heat conduction assembly 300 can conduct the heat generated during the work of the driving chip 400 to the heat dissipation layer 200, and the heat dissipation layer 200 dissipates the heat, such that the heat in a bonding region of the driving chip 400 in the display panel 100 can be quickly dissipated, avoiding a problem of burn damage to the display panel 100 caused by the concentrated heat in the bonding region.

With the application of the heat conduction assembly 300 according to the embodiment of the present disclosure, the bending part 130 for connecting the first part 110 and the second part 120 of the display panel 100 can be bent in a circular arc state. The heat conduction assembly 300 serves as the support between the first part 110 and the second part 120 of the display panel 100, thereby preventing a display device inside the display panel from being damaged due to a too small bending angle of the display panel 100.

In some embodiments, referring to FIG. 1, the first part 110 and the second part 120 are parallel, and the bending part 130 is bent in a circular arc shape.

In some embodiments, referring to FIG. 2, the heat dissipation layer 200 is laid over an entire surface of a side, proximal to the second part 120, of the first part 110. In an exemplary embodiment, the heat dissipation layer 200 may be a heat dissipation film layer for heat dissipation.

In some embodiments, the heat conduction assembly 300 may be a cube, and the size of the cube may be 54.4 mm*6.82 mm*0.21 mm. Here, 54.4 mm, 6.82 mm, and 0.21 mm are respectively the length, the width and the height of the cube. Both the length direction and the width direction of the cube may be parallel to the second part 120, and the height direction of the cube may be perpendicular to the second part 120.

Figure 3:
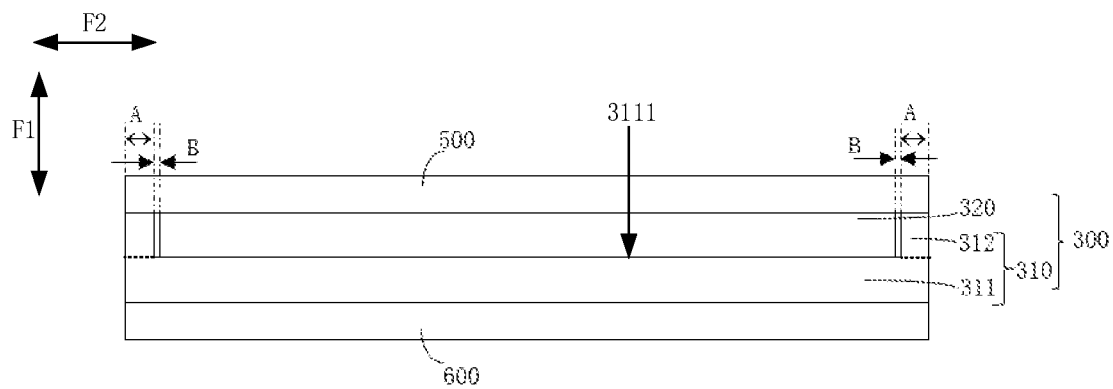
FIG. 3 is a front schematic structure view of a heat conduction assembly, a second adhesive layer and a third adhesive layer according to an embodiment of the present disclosure.
Figure 4:
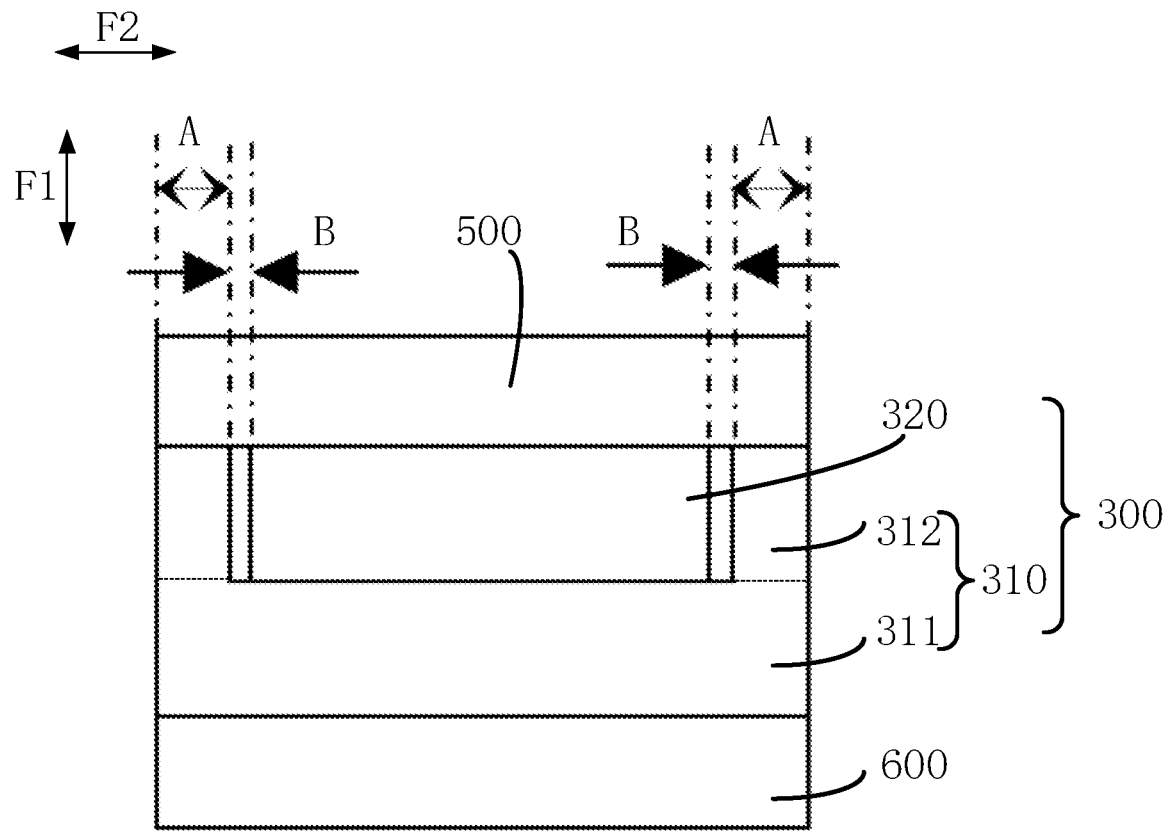
FIG. 4 is a right schematic structure view of FIG. 3.
Figure 5:
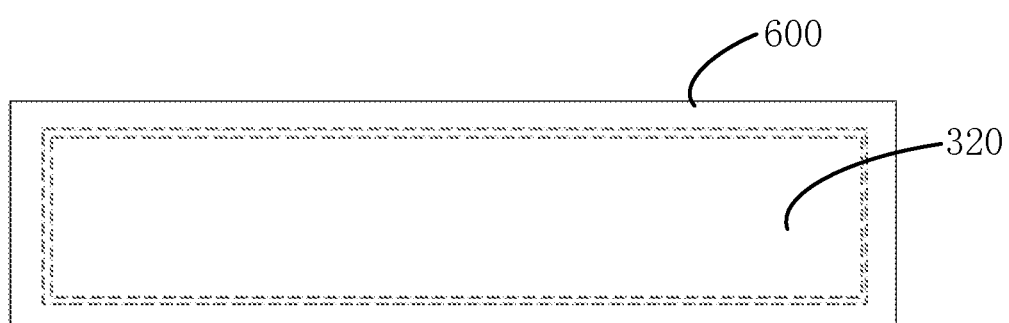
FIG. 5 is a bottom schematic bottom view of FIG. 3.

In some embodiments, as shown in FIGS. 3, 4, and 5, the heat conduction assembly 300 includes a supporting structure 310 and a heat conduction structure 320.

The supporting structure 310 includes a base portion 311 and a protruding portion 312, wherein the protruding portion 312 surrounds a periphery of a target side 3111 of the base portion 311; and the protruding portion 312 and the base portion 311 form a receiving chamber. The target side 3111 may be any side of the base portion 311, such as the upper side of the base portion 311 shown in FIG. 3.

In some embodiments, the base portion 311 and the protruding portion 312 are of an integrally-formed structure. The supporting structure 310 may be made of polyethylene terephthalate (PET). For example, both the base portion 311 and the protruding portion 312 are made of PET.

The supporting structure 310 is configured to provide a receiving chamber configured to receive the heat conduction structure 320. Meanwhile, the supporting structure 310 can serve as a support between the first part 110 and the second part 120 conveniently as it wholly has a thickness in the first direction F1. The first direction is perpendicular to the second part 120.

The heat conduction structure 320 is disposed in the receiving chamber, and is fixedly connected to the supporting structure 310. Disposing the heat conduction structure 320 in the receiving chamber can prevent the heat conduction material (for example, graphite) of the heat conduction structure 320 from falling off powder, avoiding foreign matter on the display panel 100.

In some embodiments, the supporting structure 310 may further include others besides the base portion 311 and the protruding portion 312. For example, the supporting structure 310 may further include a covering portion (not shown in the drawings). The covering portion is disposed on a side, distal from the base portion 311, of the protruding portion 312, is configured to cover the receiving chamber, and may also be made of PET.

In some embodiments, the heat conduction structure 320 is disposed between the supporting structure 310 and the heat dissipation layer 200, or the heat conduction structure 320 is disposed between the supporting structure 310 and the second part 120.

In some embodiments, referring to FIG. 2, the dashed frame in the heat conduction assembly 300 represents the heat conduction structure 320.

In some embodiments, the heat conduction structure 320 is made of graphite excellent in heat conduction and endowed with a powder-like material property. Therefore, the heat conduction structure 320 needs to be placed in the receiving chamber of the supporting structure 310. It is conceivable that the heat conduction structure 320 may also be made of other materials excellent in heat conduction.

In some embodiments, referring to FIG. 3, the heat conduction structure 320 is a plate-shaped integrated structure, such that the area of the orthographic projection of the heat conduction structure 320 on the heat dissipation layer 200 can be increased conveniently, thereby improving the heat dissipation effect of the display module. In the case that the heat conduction structure 320 is the plate-shaped integrated structure, the heat conduction structure 320 may be a whole-surface structure or a structure with a hollowed-out pattern (such as a round hole).

A surface of a side, proximal to the heat dissipation layer 200, of the heat conduction structure 320 is flush with a surface of a side, proximal to the heat dissipation layer 200, of the protruding portion 312. In other words, a surface of a side, distal from the base portion 311, of the heat conduction structure 320 is flush with a surface of a side, distal from the base portion 311, of the protruding portion 312. In this way, the heat conduction structure 320 and the protruding portion 312 are both fixedly connected to the heat dissipation layer 200, and both can conduct heat to the heat dissipation layer 200.

In some embodiments, referring to FIGS. 3 and 4, the spacing B exists between the heat conduction structure 320 and the protruding portion 312, and is less than 0.3 mm. The spacing B may be used as a geometric tolerance for attachment of the heat conduction structure 320. In some embodiments, the spacing B is generally about 0.2 mm, and is mainly determined by a process. The smaller the spacing B is, the better the effect is.

In some embodiments, a thickness of the heat conduction structure 320 in the first direction F1 ranges from 0.01 mm to 0.15 mm. For example, the thickness ranges from 0.02 mm to 0.1 mm. In an exemplary embodiment, the thickness of the heat conduction structure 320 in the first direction F1 may be 0.05 mm. In some embodiments, the thickness range of the heat conduction structure 320 in the first direction F1 includes 0.02 mm and 0.1 mm.

It should be noted that for any one of ranges M to N (such as the thickness range 0.02 mm to 0.1 mm, or other ranges) in the embodiments of the present disclosure, any one of the ranges may or may not include M, and may or may not include N, which is not limited in the embodiments of the present disclosure.

In some embodiments, a thickness of the base portion 311 in the first direction F1 ranges from 0.04 mm to 0.3 mm. For example, the thickness ranges from 0.06 mm to 0.25 mm. In some embodiments, the thickness of the base portion 311 in the first direction includes 0.06 mm and 0.25 mm. In some embodiments, the thickness of the base portion 311 in the first direction F1 may be 0.1 mm.

In some embodiments, a thickness A of the protruding portion 312 in the second direction F2 ranges from 0.5 mm to 3 mm. For example, the thickness ranges from 0.8 mm to 1.5 mm; and the second direction F2 is perpendicular to the first direction F1. In some embodiments, a thickness A of the protruding portion 312 in the second direction includes 0.8 mm and 1.5 mm. The thickness A may be about 1 mm. On the premise of satisfying a wrapping effect of the supporting structure 310 on the heat conduction structure 320, the thickness A is as small as possible to enable a heat conduction area of the heat conduction structure 320 to be as large as possible.

In some embodiments, the heat conduction assembly 300 further includes a first adhesive layer (not shown in the drawings) disposed between the heat conduction structure 320 and the supporting structure 310. The heat conduction structure 320 is fixedly connected to the supporting structure 310 by the first adhesive layer.

In some embodiments, a thickness of the first adhesive layer in the first direction F1 ranges from 0.01 mm to 0.05 mm. In some embodiments, the thickness range of the first adhesive layer in the first direction F1 includes 0.01 mm and 0.05 mm.

In some embodiments, referring to FIGS. 3 and 4, the display module further includes a second adhesive layer 500 disposed between the heat conduction assembly 300 and the heat dissipation layer 200. The heat conduction assembly 300 is fixedly connected to the heat dissipation layer 200 by the second adhesive layer 500. In some embodiments, a thickness of the second adhesive layer 500 in the first direction F1 ranges from 0.02 mm to 0.1 mm. The thickness range of the second adhesive layer 500 in the first direction F1 includes 0.02 mm and 0.1 mm.

In some embodiments, referring to FIGS. 3 and 4, the display module further includes a third adhesive layer 600 disposed between the heat conduction assembly 300 and the second part 120. The heat conduction assembly 300 is fixedly connected to the second part 120 by the third adhesive layer 600. In some embodiments, a thickness of the third adhesive layer 600 in the first direction F1 ranges from 0.02 mm to 0.1 mm. In some embodiments, the thickness range of the third adhesive layer 600 in the first direction F1 includes 0.02 mm and 0.1 mm.

In some embodiments, the second adhesive layer 500 and the third adhesive layer 600 are both high-viscosity adhesives. For example, the peeling force of the high-viscosity adhesive is above 2000 gf/inch. The second adhesive layer 500 and the third adhesive layer 600 may be double-sided adhesives. The thicknesses of the second adhesive layer 500 and the third adhesive layer 600 in the first direction F1 may be 0.03 mm.

In some embodiments, referring to FIG. 5, the two dashed frames respectively represent the heat conduction structure 320 and the outer edge of the receiving chamber; and the spacing between the two dashed frames is the spacing B.

The orthographic projection of the heat conduction structure 320 on the second part 120 is represented by a first rectangle (shown as an inside dashed frame in FIG. 5), and the orthographic projection of the supporting structure 310 on the second part 120 is represented by a second rectangle (shown as an outside dashed frame in FIG. 5). The center of the first rectangle may coincide with that of the second rectangle; the length direction of the first rectangle is parallel to that of the second rectangle; and the width direction of the first rectangle is parallel to that of the second rectangle.

In some embodiments, the length of the first rectangle ranges from 19 mm to 119 mm, and the width of the first rectangle ranges from 4 mm to 19 mm. The length of the second rectangle ranges from 20 mm to 120 mm, and the width of the second rectangle ranges from 5 mm to 20 mm. In some embodiments, the length range of the first rectangle includes 19 mm and 119 mm, the width range of the first rectangle includes 4 mm and 19 mm. The length range of the second rectangle includes 20 mm and 120 mm, and the width range of the second rectangle includes 5 mm and 20 mm.

In the embodiment of the present disclosure, an example in which the orthographic projection of the heat conduction structure 320 on the second part 120 is represented by the first rectangle and the orthographic projection of the supporting structure 310 on the second part 120 is represented by the second rectangle is taken. In some embodiments, the shape of the two orthographic projections may not be rectangular, and for example, may be convex-shaped, trapezoid, or the like, which is not limited in the embodiments of the present disclosure.

In some embodiments, referring to FIG. 1, the heat dissipation layer 200 includes at least one film layer (these film layers are not shown in FIG. 1), wherein a film layer, in the at least one film layer, on a side proximal to the heat conduction assembly 300 is a metal layer. Since the metal layer is excellent in heat conduction, it can easily dissipate the heat from the heat conduction assembly.

In some embodiments, the area of the orthographic projection of the metal layer on the first part 110 may be the same as the area of the orthographic projection of the entire heat dissipation layer 200 on the first part 110, such that the heat dissipation effect of the heat dissipation layer 200 is improved.

In some embodiments, the material of the metal layer is copper foil. It is conceivable that other metals that can dissipate heat may be used as the material of the metal layer in the embodiments of the present disclosure.

In some embodiments, a thickness of the metal layer in the first direction ranges from 0.03 mm to 0.05 mm. In some embodiments, the thickness range of the metal layer in the first direction includes 0.03 mm and 0.05 mm.

In some embodiments, the at least one film layer in the heat dissipation layer 200 may further include a foam layer (not shown in the drawings) disposed between the metal layer and the first part 110.

In some embodiments, the display module further includes a fourth adhesive layer (not shown in the drawings) disposed between the heat dissipation layer 200 and the first part 110.

The heat dissipation layer 200 is fixedly connected to the first part 110 by the fourth adhesive layer.

In an exemplary embodiment, in the case that the heat dissipation layer 200 includes the foam layer and the metal layer, the foam layer is disposed between the metal layer and the first part 110, and a side, distal from the metal layer, of the foam layer is fixedly connected to the first part 110 by the fourth adhesive layer (such as grid glue).

In some embodiments, a thickness of the fourth adhesive layer in the first direction ranges from 0.01 mm to 0.1 mm. In some embodiments, the thickness range of the fourth adhesive layer in the first direction includes 0.01 mm and 0.1 mm.

In the display module according to the embodiment of the present disclosure, the fixed connections of all the components are realized by the adhesive layers (such as the first adhesive layer, the second adhesive layer, the third adhesive layer, and the fourth adhesive layer). The material of each of the adhesive layers may be a high-viscosity adhesive, such that the components can be firmly connected by the adhesive layers, thereby ensuring the effective contact between the components to facilitate heat conduction and heat dissipation.

Figure 6:
FIG. 6 is a front schematic structure view of a display device according to an embodiment of the present disclosure.
Figure 7:
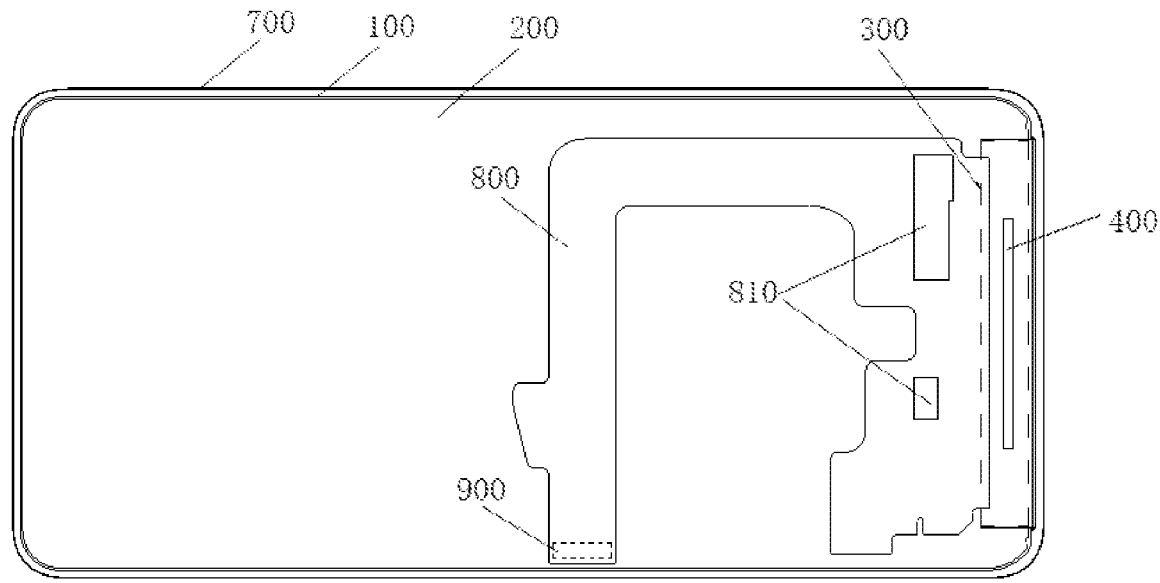
FIG. 7 is a top schematic structure view of a display device according to an embodiment of the present disclosure.
Figure 8:
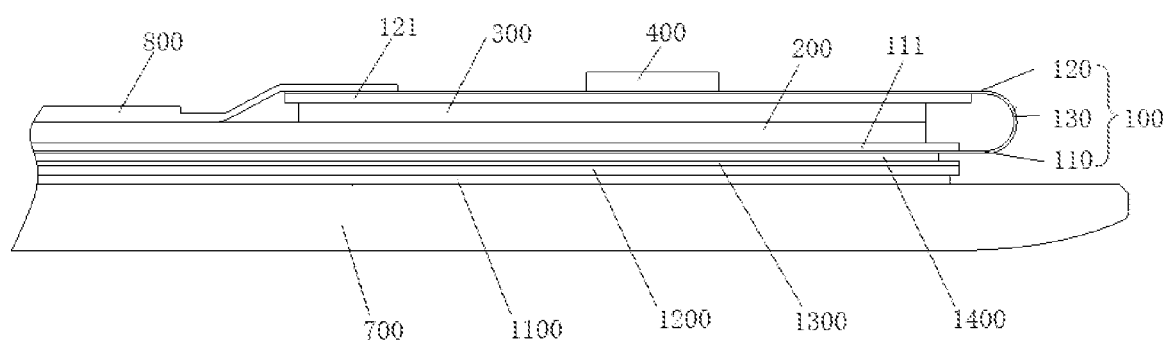
FIG. 8 is a schematic enlarged structure diagram of part C in FIG. 6.

Based on the same inventive concept, the embodiments of the present disclosure provide a display device. Referring to FIGS. 6 to 8, the display device includes a power supply assembly, and the display module according to any one of the embodiments of the present disclosure. The power supply assembly is configured to supply power to the display module. The power supply assembly may be an external power supply, or a battery built in the display device (such as a mobile phone and a tablet computer).

In some embodiments, referring to FIG. 6, the heat conduction assembly 300 according to the embodiment of the present disclosure is disposed at a bending position C on one side of the whole display panel 100.

In some embodiments, referring to FIGS. 7 and 8, the display device further includes: a glass cover (GC) 700, a flexible printed circuit (FPC) board 800, a connector 900, a sensor 1300, a first optically clear adhesive (OCA) layer 1100, a second OCA layer 1400 and a polarizer (POL) 1200.

In some embodiments, the glass cover 700 is disposed on a side, distal from the heat dissipation layer 200, of the first part 110 in the display panel 100. The FPC board 800 is fixedly connected to the heat dissipation layer 200. The connector 900 is fixedly connected to the heat dissipation layer 200 and the FPC board 800 respectively. The FPC board 800 includes a plurality of components 810 including at least part of the components such as capacitors, resistors and inductors.

In some embodiments, referring to FIG. 8, the first part 110 of the display panel 100 includes: a first substrate 111, and a first display part disposed on a side, distal from the second part 120, of the first substrate 111. The second part 120 includes a second substrate 121, and a second display part disposed on a side, distal from the first part 110, of the second substrate 121. One side of the FPC board 800 extends to the second display part and is fixedly connected to the second display part; and the heat conduction assembly 300 is fixedly connected to the second substrate 121 of the second part 120, and the heat dissipation layer 200 is fixedly connected to the first substrate 111 of the first part 110. The second OCA layer 1400, the sensor 1300, the polarizer 1200, the first OCA layer 1100 and the glass cover 700 are sequentially stacked on a side, distal from the second part 120, of the first display part of the first part 110.

By applying the embodiments of the present disclosure, at least the following beneficial effects can be achieved.

(1) The heat conduction assembly 300 according to the embodiments of the present disclosure can conduct the heat generated during the work of the driving chip 400 to the heat dissipation layer 200, and the heat dissipation layer 200 evenly distributes the heat, such that the heat in the bonding region of the driving chip 400 can be quickly dissipated, thereby avoiding the problem of the burn damage to the display panel 100 caused by the concentrated heat in the bonding region.

(2) With the heat conduction assembly 300 according to the embodiments of the present disclosure, the bending part 130 of the display panel 100 can be bent in a circular arc state. The heat conduction assembly 300 serves as the support between the first part 110 and the second part 120 of the display panel 100, thereby preventing the display effect of the display panel from being adversely affected by excessive bending of the display panel 100.

(3) Disposing the heat conduction structure 320 according to the embodiments of the present disclosure in the receiving chamber of the supporting structure 310 prevents the heat conduction material (for example, graphite) of the heat conduction structure 320 from falling off powder, avoiding foreign matter on the display panel. Meanwhile, the heat conduction structure 320 is the plate-shaped integrated structure, such that the area of the orthographic projection of the heat conduction structure 320 on the heat dissipation layer 200 can be increased conveniently, thereby improving the heat dissipation effect of the display module.

(4) The metal layer is arranged on a side, proximal to the heat conductive assembly 300, of the heat dissipation layer 200 according to the embodiments of the present disclosure. Since the metal layer is excellent in heat conduction, it can easily dissipate the heat from the heat conduction assembly. The fixed connections of all the components are realized by the adhesive layers. The material of each of the adhesive layers may be the high-viscosity adhesive, such that the components can be firmly connected by the adhesive layers, thereby ensuring the effective contact between the components to facilitate heat conduction and heat dissipation.

The display device according to the embodiments of the present disclosure may be a liquid crystal panel, electronic paper, an organic light-emitting diode (OLED) device, a light-emitting diode (LED) device, a micro light-emitting diode display device, a terminal, a mobile phone, a tablet computer, a television, a display, a notebook computer, a digital photo frame, a navigator or any other product or member having a display function.

Figure 9:
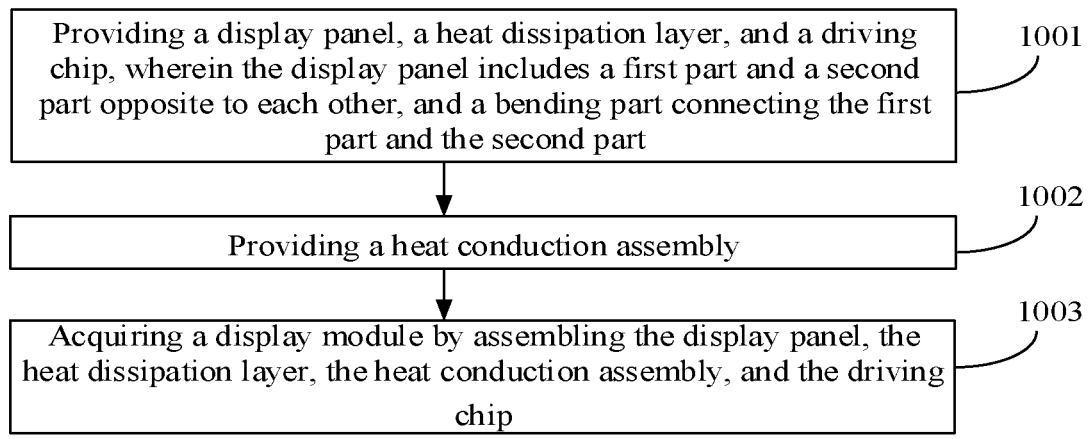
FIG. 9 is a flowchart of a method for manufacturing a display module according to an embodiment of the present disclosure.

Based on the same inventive concept, a method for manufacturing a display module is provided according to the embodiments of the present disclosure. The method is configured to manufacture any one of the display modules according to the embodiments of the present disclosure, such as the display module shown in FIGS. 1 to 5. Referring to FIG. 9, the method for manufacturing the display module includes the following steps.

In 1001, a display panel, a heat dissipation layer, and a driving chip are provided, wherein the display panel includes a first part and a second part opposite to each other, and a bending part connecting the first part and the second part.

In 1002, a heat conduction assembly is provided.

In 1003, the display module is acquired by assembling the display panel, the heat dissipation layer, the heat conduction assembly, and the driving chip.

In the display module assembled in 1003, the heat dissipation layer is disposed on a side of the first part proximal to the second part, and is fixedly connected to the first part; the heat conduction assembly is disposed between the heat dissipation layer and the second part, and is fixedly connected to the heat dissipation layer and the second part; the area of the orthographic projection of the heat conduction assembly on the first part is smaller than the area of the orthographic projection of the heat dissipation layer on the first part; and the driving chip is disposed on a side, distal from the first part, of the second part.

In some embodiments, the heat conduction assembly includes a supporting structure and a heat conduction structure; the supporting structure includes a base portion and a protruding portion, and the protruding portion surrounds the periphery of the target side of the base portion; the protruding portion and the base portion form a receiving chamber; and the heat conduction structure is fixedly connected to the supporting structure. Here, in 1002, first, an initial structure may be provided; then, the supporting structure including the base portion and the protruding portion is acquired by processing the initial structure; and finally, the heat conduction structure is arranged in the receiving chamber of the supporting structure. In other words, the receiving chamber may be formed on the initial structure to acquire the supporting structure. For example, a one-time patterning process is adopted to process the initial structure to form the receiving chamber on the initial structure.

The one-time patterning process includes: photoresist coating, exposure, development, etching, and photoresist stripping. Adopting the one-time patterning process to process the initial structure includes: coating a layer of photoresist on the initial structure; exposing the photoresist using a mask to enable the photoresist to form an exposed region and a non-exposed region; processing by a developing process to remove the photoresist in either the exposed region or the non-exposed region and remain the photoresist in the other region; etching the region not covered with the photoresist on the initial structure; and acquiring the supporting structure by stripping the photoresist on the initial structure upon completion of the etching.

It should be noted that the photoresist may be a positive photoresist or a negative photoresist. Where the photoresist is the positive photoresist, upon the development process, the photoresist in the exposed region is removed, while the photoresist in the non-exposed region remains. Where the photoresist is the negative photoresist, upon the development process, the photoresist in the non-exposed region is removed, while the photoresist in the exposed region remains.

The above content takes an example in which the supporting structure is acquired by processing the initial structure. In some embodiments, when forming the supporting structure, first, the base portion may be provided, and then, the protruding portion may be formed on the target side of the base portion to acquire the supporting structure.

In some embodiments, the heat conduction assembly further includes a first adhesive layer. Before arranging the heat conduction structure in the receiving chamber of the supporting structure, first, the first adhesive layer may be arranged in the receiving chamber of the supporting structure; and then, the heat conduction structure may be arranged in the receiving chamber. In this way, the first adhesive layer is disposed between the heat conduction structure and the supporting structure, and the heat conduction structure is fixedly connected to the supporting structure by the first adhesive layer.

In some embodiments, the supporting structure further includes a covering portion. In the case that the heat conduction structure is arranged in the receiving chamber of the supporting structure, the covering portion may be arranged on a side, distal from the base portion, of the protruding portion, such that the covering portion covers the receiving chamber.

In some embodiments, the display module further includes: a second adhesive layer. When the display panel, the heat dissipation layer, the heat conduction assembly, and the driving chip are assembled in 1003, the heat conduction assembly may be fixedly connected to the heat dissipation layer by the second adhesive layer.

In some embodiments, the display module further includes: a third adhesive layer. When the display panel, the heat dissipation layer, the heat conduction assembly, and the driving chip are assembled in 1003, the heat conduction assembly may be fixedly connected to the second part by the third adhesive layer.

In some embodiments, the display module further includes: a fourth adhesive layer. During assembling of the display panel, the heat dissipation layer, the heat conduction assembly, and the driving chip in 1003, the heat dissipation layer may be fixedly connected to the first part by the fourth adhesive layer.

It should be noted that the method embodiments and the corresponding display module embodiments according to the embodiments of the present disclosure may be cross referenced, which is not limited in the embodiments of the present disclosure. For example, for the structure of the display module manufactured by the method embodiments according to the embodiments of the present disclosure, reference may be made to the structure of any one of the display modules according to the embodiments of the present disclosure.

It can be understood by those skilled in the art that steps, measures and solutions in various operations, methods and processes discussed in the present disclosure may be alternated, modified, combined or deleted. Further, other steps, measures and solutions, with the various operations, methods and processes discussed in the present disclosure, may also be alternated, modified, rearranged, split, combined, or deleted. Further, steps, measures, and solutions in the prior art, with the various operations, methods and processes discussed in the present disclosure, may also be alternated, modified, rearranged, split, combined or deleted.

In the description of the present invention, it should be understood that the orientation or position relations indicated via terms of "central," "upper," "lower," "front," "rear," "left," "right," "vertical," "horizontal," "top," "bottom," "inner," "outer," and the like are based on orientation or the position relations shown in the accompanying drawings only to describe the present disclosure conveniently and simplify the description, but not indicate or imply that referred structures must have particular orientations or be constructed and operated with the particular orientation, and thus, they cannot be construed as limitations to the present disclosure.

The terms "first" and "second" are only for the purpose of description and should not be construed as indicating or implying relative importance or implicitly indicating the number of technical features indicated. Thus, the features defined by the terms "first" and "second" may include one or more of the features either explicitly or implicitly. In the description of the present disclosure, unless otherwise stated, the term "a plurality of" means two or more.

It should be noted that, unless otherwise definitely specified and limited, the terms "mounted," "connected with each other," and "connected to" need to be broadly understood, for example, connection may be fixed connection, or detachable connection or integrated connection; or may be direct connection, or indirect connection via an intermediation, or communication of inner parts of two elements. A person of ordinary skill in the art can understand the specific meaning of the terms in the present disclosure in accordance with specific conditions.

In the description of this specification, the particular features, structures, materials or characteristics may be integrated with any one or more embodiments or examples in a proper fashion.

It should be understood that although the various steps in the flowchart of the accompanying drawings are sequentially displayed as indicated by the arrows, these steps are not necessarily performed in the order indicated by the arrows. Except as explicitly stated herein, the execution of these steps is not strictly limited, and may be performed in other sequences. Moreover, at least some of the steps in the flowchart of the accompanying drawings may include a plurality of sub-steps or stages, which are not necessarily performed at the same time, but may be executed at different time. The execution order thereof is also not necessarily performed sequentially, but may be performed in turn or alternately with at least part of other steps or sub-steps or stages of other steps.

Described above are only some embodiments of the present disclosure, and it should be noted that those skilled in the art may also make several improvements and modifications without departing from the principles of the present disclosure which should be considered as the scope of protection of the present disclosure.

What is claimed is:

1. A display module, comprising:
   a display panel, comprising a first part and a second part opposite to each other, and a bending part connecting the first part and the second part;
   a heat dissipation layer, disposed on a side, proximal to the second part, of the first part, and fixedly connected to the first part;
   a heat conduction assembly, disposed between the heat dissipation layer and the second part, and fixedly connected to the heat dissipation layer and the second part, wherein an area of an orthographic projection of the heat conduction assembly on the first part is smaller than an area of an orthographic projection of the heat dissipation layer on the first part; and
   a driving chip, disposed on a side, distal from the first part, of the second part;
   wherein the heat conduction assembly comprises:
   a supporting structure, comprising a base portion and a protruding portion, wherein the protruding portion surrounds a periphery of a target side of the base portion, and the protruding portion and the base portion form a receiving chamber; and
   a heat conduction structure, disposed in the receiving chamber, and fixedly connected to the supporting structure; the heat conduction structure is a plate-shaped integrated structure, and a surface of a side, distal from the base portion, of the heat conduction structure is flush with a surface of a side, distal from the base portion, of the protruding portion;
   an orthographic projection of the driving chip on the second part is within an orthographic projection of the heat conduction assembly on the second part:
   a spacing between the heat conduction structure and the protruding portion is less than 0.3 mm; a thickness of the heat conduction structure in a first direction ranges from 0.02 mm to 0.1 mm, wherein first direction is perpendicular to the second part;
   a thickness of the base portion in the first direction ranges from 0.06 mm to 0.25 mm;
   a thickness of the protruding portion in a second direction ranges from 0.8 mm to 1.5 mm, wherein the second direction is perpendicular to the first direction;

the heat conduction assembly further comprises a first adhesive layer, a second adhesive layer and a third adhesive layer; wherein the first adhesive layer is disposed between the heat conduction structure and the supporting structure, and the heat conduction structure is fixedly connected to the supporting structure by the first adhesive layer;

the second adhesive layer is disposed between the heat conduction assembly and the heat dissipation layer, and the heat conduction assembly is fixedly connected to the heat dissipation layer by the second adhesive layer;

the third adhesive layer is disposed between the heat conduction assembly and the second part, and the heat conduction assembly is fixedly connected to the second part by the third adhesive layer;

a thickness of the first adhesive layer in the first direction ranges from 0.01 mm to 0.05 mm;

a thickness of the second adhesive layer in the first direction ranges from 0.02 mm to 0.1 mm; and a thickness of the third adhesive layer in the first direction ranges from 0.02 mm to 0.1 mm;

the heat dissipation layer comprises at least one film layer, wherein a film layer, in the at least one film layer, on a side proximal to the heat conduction assembly is a metal layer;

wherein a thickness of the metal layer in the first direction ranges from 0.03 mm to 0.05 mm;

the display module further comprises a fourth adhesive layer disposed between the heat dissipation layer and the first part, and the heat dissipation layer is fixedly connected to the first part by the fourth adhesive layer;

wherein a thickness of the fourth adhesive layer in the first direction ranges from 0.01 mm to 0.1 mm;

the supporting structure further comprises: a covering portion, disposed on a side, distal from the base portion, of the protruding portion, wherein the covering portion covers the receiving chamber;

the heat conduction assembly satisfies at least one of the following conditions:

a material of the supporting structure comprises polyethylene terephthalate PET; and a material of the heat conduction structure comprises graphite; and the heat conduction assembly satisfies either of the following conditions:

the heat conduction structure is disposed between the supporting structure and the heat dissipation layer; and the heat conduction structure is disposed between the supporting structure and the second part.

2. A display device, comprising: a power supply assembly, and the display module as defined in claim 1, wherein the power supply assembly is configured to supply power to the display module.

3. The display module according to claim 1, wherein each of the first part and the second part is provided with a supporting protection film, the heat dissipation layer is fixedly connected to the supporting protection film of the first part, and the heat conduction assembly is fixedly connected to the supporting protection film of the second part.

4. The display module according to claim 1, wherein the base portion and the protruding portion are of an integrally-formed structure.

5. The display module according to claim 1, wherein the base portion, the protruding portion, and the covering portion are made of polyethylene terephthalate (PET).

6. The display module according to claim 1, wherein the heat conduction structure is a whole-surface structure or a structure with a hollowed-out pattern.

7. The display module according to claim 1, wherein the second adhesive layer and the third adhesive layer are both high-viscosity adhesives.

8. The display module according to claim 7, wherein a peeling force of the high-viscosity adhesive is above 2000 gf/inch.

9. The display device according to claim 2, wherein each of the first part and the second part is provided with a supporting protection film, the heat dissipation layer is fixedly connected to the supporting protection film of the first part, and the heat conduction assembly is fixedly connected to the supporting protection film of the second part.

10. The display device according to claim 2, wherein the base portion and the protruding portion are of an integrally-formed structure.

11. The display device according to claim 2, wherein the base portion, the protruding portion, and the covering portion are made of polyethylene terephthalate (PET).

12. The display device according to claim 2, wherein the heat conduction structure is a whole-surface structure or a structure with a hollowed-out pattern.

13. The display device according to claim 2, wherein the second adhesive layer and the third adhesive layer are both high-viscosity adhesives.

14. The display device according to claim 13, wherein a peeling force of the high-viscosity adhesive is above 2000 gf/inch.

* * * * *